(12) United States Patent
Tachino et al.

(10) Patent No.: US 7,906,033 B2
(45) Date of Patent: Mar. 15, 2011

(54) PLASMA ETCHING METHOD AND APPARATUS

(75) Inventors: Yuuichi Tachino, Kasugai (JP); Minoru Suzuki, Kasugai (JP); Koji Ibi, Kasugai (JP); Genichi Komuro, Kawasaki (JP); Yoichi Okita, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/168,415

(22) Filed: Jun. 29, 2005

(65) Prior Publication Data

US 2005/0252885 A1 Nov. 17, 2005

Related U.S. Application Data

(62) Division of application No. 09/775,653, filed on Feb. 5, 2001, now Pat. No. 6,926,800.

(30) Foreign Application Priority Data

Aug. 25, 2000 (JP) ................................ 2000-255549

(51) Int. Cl.
C03C 15/00 (2006.01)
H01L 21/461 (2006.01)

(52) U.S. Cl. .......................................... 216/68; 438/710

(58) Field of Classification Search .................. 216/68; 438/710, 729; 118/723 I, 723 IR, 723 AN; 156/345.48, 345.49; 315/111.51
See application file for complete search history.

(56) References Cited

U.S. PATENT DOCUMENTS

| | | | |
|---|---|---|---|
| 5,525,379 A | | 6/1996 | Takada et al. |
| 5,800,620 A | * | 9/1998 | Rudder et al. ............... 118/723 I |
| 5,879,575 A | * | 3/1999 | Tepman et al. .................. 216/68 |
| 5,888,413 A | * | 3/1999 | Okumura et al. ............... 216/68 |
| 6,056,848 A | | 5/2000 | Daviet |
| 6,229,264 B1 | * | 5/2001 | Ni et al. .................... 315/111.51 |
| 6,355,183 B1 | * | 3/2002 | Ohkuni .......................... 216/67 |
| 6,564,810 B1 | | 5/2003 | Raaijmakers et al. |

FOREIGN PATENT DOCUMENTS

| | | |
|---|---|---|
| JP | 08-306659 | 11/1996 |
| JP | 09-237778 | 9/1997 |
| JP | 10-152784 | 6/1998 |
| JP | 10302997 | 11/1998 |
| JP | 11-097422 | 4/1999 |
| JP | 11-092968 | 6/1999 |

OTHER PUBLICATIONS

Japanese Patent Office Action for corresponding Japanese Patent application No. 2000-255549—dated Jun. 20, 2006.
Non-final Office Action issued on Sep. 25, 2002 in the parent U.S. Appl. No. 09/775,653.
Final Office Action issued on Apr. 4, 2003 in the parent U.S. Appl. No. 09/775,653. Non-final Office Action issued on Oct. 16, 2003 in the parent U.S. Appl. No. 09/775,653.
Final Office Action issued on Jun. 30, 2004 in the parent U.S. Appl. No. 09/775,653.
Notice of Allowance issued on Mar. 28, 2005 in the parent U.S. Appl. No. 09/775,653.

* cited by examiner

*Primary Examiner* — Luz L. Alejandro
(74) *Attorney, Agent, or Firm* — Staas & Halsey LLP

(57) ABSTRACT

A plasma etching apparatus for etching semiconductor wafers. The plasma etching apparatus has a reaction tube made of a dielectric material and a high frequency antenna located around the reaction tube for generating a plasma inside the reaction tube. The high frequency antenna has a sloped segment that produces a relatively large capacitive coupling with the reaction tube. The high frequency antenna is moved by a driver around the reaction tube in a horizontal plane.

2 Claims, 9 Drawing Sheets

Fig.5

| Numbers of wafers rotation | Rotation rate (rpm) | Number of processed wafers | Particle size | Initial particle number | Particle number after processing | Difference | TOTAL |
|---|---|---|---|---|---|---|---|
| 0 | 0 | 25 | S | 19 | 26 | +7 | +31 |
| | | | SM | 1 | 12 | +11 | |
| | | | M | 0 | 13 | +13 | |
| | | | L | 0 | 0 | 0 | |
| | | 100 | S | 10 | 18 | +8 | +17 |
| | | | SM | 2 | 6 | +4 | |
| | | | M | 3 | 8 | +5 | |
| | | | L | 0 | 0 | 0 | |
| Approx. 3.75 | Approx. 0.52 | 25 | S | 24 | 59 | +35 | +43 |
| | | | SM | 3 | 5 | +2 | |
| | | | M | 6 | 12 | +6 | |
| | | | L | 0 | 0 | 0 | |
| | | 100 | S | 15 | 15 | 0 | +13 |
| | | | SM | 2 | 6 | +4 | |
| | | | M | 6 | 15 | +9 | |
| | | | L | 0 | 0 | 0 | |
| | | 150 | S | 21 | 5 | -16 | -18 |
| | | | SM | 0 | 3 | +3 | |
| | | | M | 7 | 2 | -5 | |
| | | | L | 0 | 0 | 0 | |
| Approx. 37 | Approx. 0.054 | 25 | S | 2 | 23 | +21 | +33 |
| | | | SM | 1 | 8 | +7 | |
| | | | M | 8 | 13 | +5 | |
| | | | L | 0 | 0 | 0 | |
| | | 100 | S | 37 | 13 | -24 | -37 |
| | | | SM | 15 | 6 | -9 | |
| | | | M | 15 | 10 | -5 | |
| | | | L | 0 | 1 | +1 | |
| Approx. 148 | Approx. 0.0135 | 25 | S | 8 | 26 | +18 | +29 |
| | | | SM | 4 | 7 | +3 | |
| | | | M | 13 | 21 | +8 | |
| | | | L | 0 | 0 | 0 | |
| | | 100 | S | 22 | 19 | +3 | +10 |
| | | | SM | 1 | 8 | +7 | |
| | | | M | 3 | 9 | +6 | |
| | | | L | 0 | 0 | 0 | |
| | | 150 | S | 12 | 19 | +7 | +12 |
| | | | SM | 0 | 3 | +3 | |
| | | | M | 3 | 5 | +2 | |
| | | | L | 0 | 0 | 0 | |

PLASMA ETCHING METHOD AND APPARATUS

This application is a divisional application of Ser. No. 09/775,653, filed Feb. 5, 2001 now allowed, now U.S. Pat. No. 6,926,800 and claims the benefit of Japanese Patent No. 2000-255549, filed Aug. 25, 2000 in the Japanese Patent Office, the disclosure or which is incorporated herein by reference.

BACKGROUND OF THE INVENTION

The present invention relates to an etching method and apparatus, and more particularly, to a plasma etching method and apparatus for use in the manufacturing of semiconductor devices.

In the manufacturing of semiconductor devices, a functional thin film is first deposited on a semiconductor wafer. Then, unnecessary portions are removed from the thin film using an etching apparatus such as a dry etching apparatus to form a predetermined pattern.

Conventionally, materials that exhibit high reactivities to processing gases have been used for manufacturing semiconductor devices. In an etching step, a semiconductor wafer material is first placed in a processing chamber of a dry etching apparatus, followed by introduction of a processing gas into the processing chamber. The processing gas reacts with the semiconductor wafer material to produce volatile etching products. The etching products are removed from the processing chamber using an exhauster such as a vacuum pump. Therefore, little or no etching products remain in the processing chamber. Also, the wall of the processing chamber is maintained at a high temperature to effectively prevent the etching products from attaching.

In recent years, however, low reactivity materials, which exhibit very low reactivities to processing gases, have been used in the manufacturing of semiconductor devices in response to the trend of miniaturization, higher speed and higher functionality of semiconductor devices. For example, refractory metals having high melting points such as iridium (Ir) and platinum (Pt) are used as materials for electrodes of capacitors in ferroelectric memories (FeRAMs). The high melting point metals hardly combine with other atoms and molecules. Also, PZT (Lead Zirconate Titanate) and SBT (Strontium-Bismuth-Tantalum composite oxide), which are used for ceramic-based ferroelectric materials, have low reactivities.

For etching a low reactivity material, a sputter etching method based on ion collision is used. Etching products produced during sputter etching are non-volatile. The non-volatile etching products are difficult to remove with an exhauster, so they tend to remain in a processing chamber and attach to the wall of the processing chamber. The non-volatile etching products are deposited on the wall in each etching step. The temperature in the processing chamber greatly differs from the etching time to a standby state. Therefore, the deposited etching products are subjected to frequent temperature difference (thermal stress) which causes the etching products to peel off the wall. The etching products, which have peeled off, may drop on a semiconductor wafer. Relatively large pieces prevent the formation of desired patterns in the semiconductor devices.

To prevent such problems, the etching products of low reactivity materials must be removed more frequently than those produced from conventional etching materials. This however increases cleaning costs and reduces the operating time of the etching apparatus. Therefore, a need exists for an etching apparatus that prevents the etching products from attaching to the wall of the processing chamber.

A highly efficient exhauster, which promptly reduces the pressure in the processing chamber, has been used to remove non-volatile etching products from the processing chamber. This exhauster, however, has not been effective. Since the non-volatile etching products have very high melting points, a method has also been proposed for holding the temperature on the wall of the processing chamber relatively high. Unfortunately, this method has also not been effective.

Another method has also been proposed for holding the wall of a processing chamber high while keeping non-volatile deposits from thermal stress. This method does reduce the peeling of non-volatile deposits to some degree. In this method, however, thick non-volatile deposits change the atmosphere in the processing chamber. This makes the etching of semiconductor wafers unstable. Particularly, for etching a material for electrodes of capacitors, metal deposits interfere with high frequency power supplied to the processing chamber, thereby impeding the generation of plasma.

As a method of cleaning a processing chamber, a dry cleaning method introduces a cleaning gas prone to reaction with deposits into the processing chamber, without opening the processing chamber, to subject the deposits to plasma etching. However, the productivity of semiconductor devices is degraded due to interruption of etching when a cleaning sequence is performed.

SUMMARY OF THE INVENTION

It is an object of the present invention to provide an etching apparatus which prevents etching products from attaching to the wall of a processing chamber.

To achieve the above object, the present invention provides a plasma etching method for etching a workpiece. The method includes placing the workpiece in a processing chamber defined by a reaction tube made of a dielectric material, introducing a processing gas into the processing chamber, supplying high frequency power to a high frequency antenna located outside the reaction tube, generating a plasma in the processing chamber by the supplied high frequency power, and moving at least one of the high frequency antenna and the reaction tube relative to the other. The high frequency antenna has a portion that has a relatively large capacitive coupling with the reaction tube.

The present invention also provides a plasma etching apparatus for etching a workpiece. The plasma etching apparatus includes a reaction tube made of a dielectric material in the form of a cylinder, a high frequency antenna located around the reaction tube for generating a plasma inside the reaction tube, a power supply terminal connected to a plasma source high frequency power supply, a ground terminal connected to a ground, and a drive mechanism for moving at least one of the high frequency antenna and the reaction tube relative to the other. The high frequency antenna has a portion that produces a relatively large capacitive coupling with the reaction tube.

The present invention further provides a plasma processing apparatus that has a processing chamber for performing predetermined process on a workpiece. The plasma processing apparatus includes a reaction tube connected to the processing chamber, a high frequency antenna located around the reaction tube for generating a plasma inside the reaction tube, a power supply terminal connected to a plasma source high frequency power supply, a ground terminal connected to a ground, and a drive mechanism for moving at least one of the high frequency antenna and the reaction tube relative to the other. The reaction tube is made of a dielectric material in the form of a cylinder. The high frequency antenna has a portion that produces a relatively large capacitive coupling with the reaction tube.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 2b is a side view of the high frequency antenna in FIG. 2a;

FIG. 5 is a table showing the number of processed wafers and the number of particles;

FIG. 7b is a side view of the high frequency antenna in FIG. 7a;

FIG. 8b is a side view of the high frequency antenna in FIG. 8a;

FIG. 9b is a side view of the plate material in FIG. 9a;

FIG. 10b is a side view of the plate material in FIG. 10a.

DETAILED DESCRIPTION OF THE PREFERRED EMBODIMENTS

Figure 1:
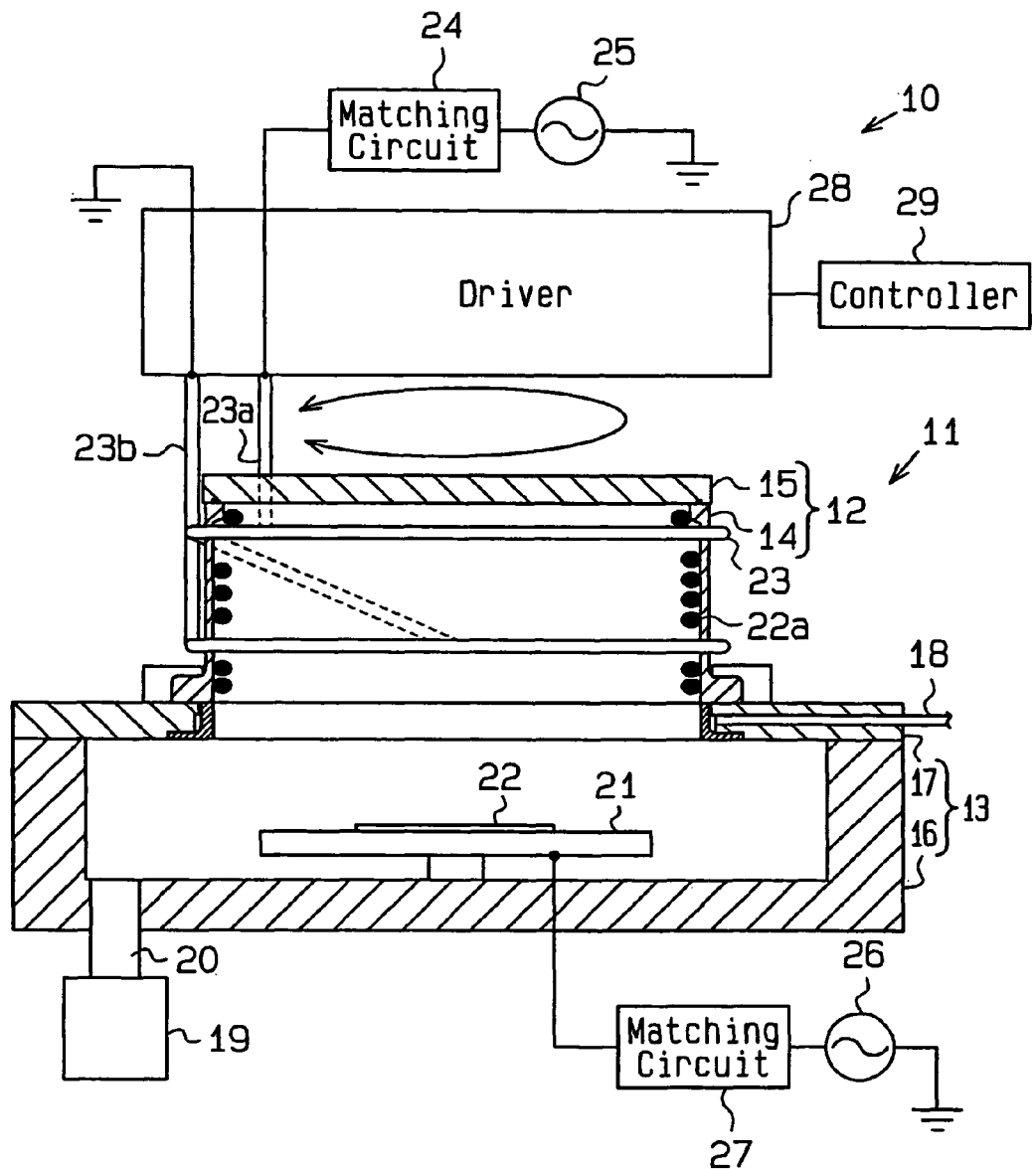
FIG. 1 is a schematic cross-sectional view illustrating a plasma etching apparatus according to a first embodiment of the present invention.

An inductively coupled plasma etching apparatus 10 according to the first embodiment of the present invention will now be described with referring to FIGS. 1 through 5.

The etching apparatus 10 has an etching chamber 11. The etching chamber 11 includes an upper processing chamber 12 and a lower processing chamber 13. The upper processing chamber 12 is formed of an reaction tube 14 and a lid 15, which covers the upper end opening of the reaction tube 14. The reaction tube 14 is preferably made of a dielectric material, such as quartz glass, and formed in a cylindrical shape.

The lower processing chamber 13 is formed of a processing container 16, which has a diameter larger than that of the reaction tube 14, and an annular lid 17, which is located on the upper end of the processing container 16. The annular lid 17 has an opening that has a diameter substantially equal to the inner diameter of the reaction tube 14. The reaction tube 14 is attached on the annular lid 17 to cover the opening. A sample carrier 21 is located on the base of the lower processing chamber 13. The sample carrier 21 includes an electrostatic chuck that has a top surface where a wafer 22 is located.

The annular lid 17 includes a gas introducing port or gas introducing passage 18 for introducing a processing gas into the etching chamber 11. The processing container 16 is connected to a vacuum pump 19 through an exhaust port or exhaust passage 20. Molecules and etching products within a plasma are removed from the processing container 16 by the vacuum pump 19.

A coil antenna 23 is located to surround the reaction tube 14. More specifically, the coil antenna 23 is wrapped about the reaction tube 14, along its outer peripheral surface, approximately twice. The coil antenna 23 supplies the etching chamber 11 with high frequency power for generating and maintaining a plasma. A coil high frequency power supply 25 is connected to a first terminal (input side terminal) 23a of the coil antenna 23. The coil antenna 23 has a second terminal 23b connected to a ground.

A biasing high frequency power supply 26 is connected to the sample carrier 21 through a high frequency impedance matching circuit 27. The biasing power supply 26 supplies the sample carrier 21 with biasing power for accelerating etchant ions within a plasma toward the wafer 22.

The coil antenna 23 is coupled to a driver 28 for moving the coil antenna 23. A controller 29 is connected to the driver 28 to control the driver 28 such that the coil antenna 23 moves relative to the reaction tube 14. The coil antenna 23 is preferably arranged for rotation in a horizontal plane (about a vertical axis) around the outer peripheral surface of the reaction tube 14.

As the etching of the wafer 22 is started, the controller 29 supplies an instruction signal to the driver 28. In response to the instruction signal, the driver 28 forces the coil antenna 23 to rotate in a horizontal plane.

Figure 2A:
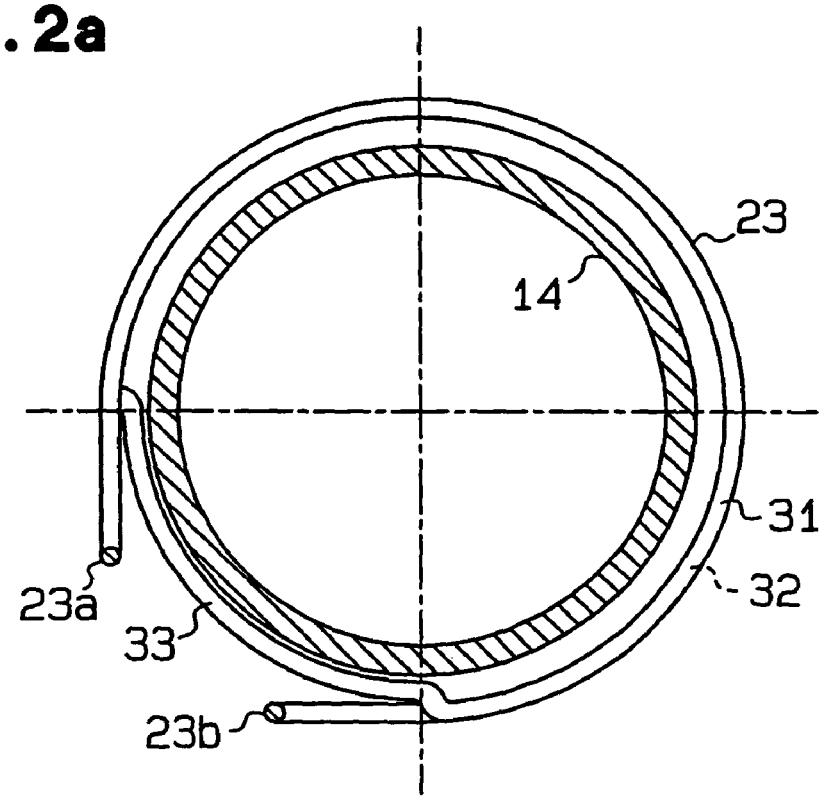
FIG. 2a is a plan view illustrating a high frequency antenna of the etching apparatus in FIG. 1.
Figure 2B:
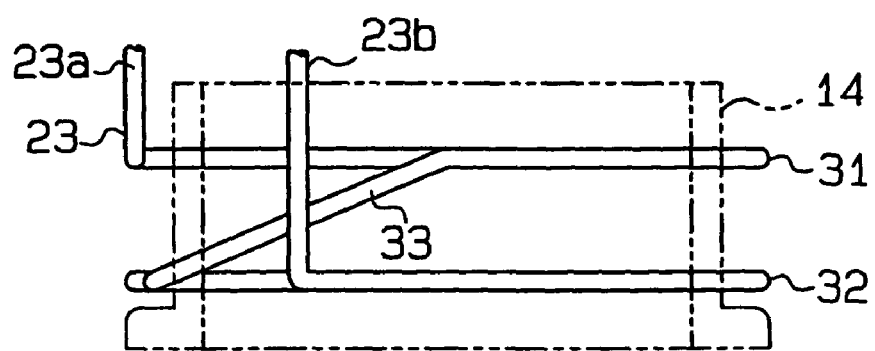

As illustrated in FIGS. 2a and 2b, the coil antenna 23 has an upper and a lower winding 31, 32, which are parallel with each other and which are separated by a predetermined spacing, and an intermediate segment or sloped segment 33, which is continuous with the upper winding 31 and the lower winding 32 and which connects the end of the upper winding 31 to the end of the lower winding 32. The upper winding 31 is connected to the power supply terminal 23a, while the lower winding 32 is connected to the ground terminal 23b.

The upper and lower windings 31, 32 are formed to wrap approximately ¾ of the way around the outer peripheral surface of the reaction tube 14. The sloped segment 33 is formed to wrap approximately ¼ of the way around the reaction tube 14. The spacing between the sloped segment 33 and the outer peripheral surface of the reaction tube 14 is extremely small as compared with the spacing between the upper and lower windings 31, 32 and the outer peripheral surface of the reaction tube 14.

Since the sloped segment 33 is in close proximity to the outer peripheral surface of the reaction tube 14, the sloped segment 33 has a reactive coupling larger than those of the upper and lower windings 31, 32. When the spacing between the coil antenna 23 and the reaction tube 14 is equal, the reactive coupling becomes larger at locations closer to the power supply terminal 23a and smaller at locations closer to the ground terminal 23b. In the first embodiment, since the sloped segment 33 is located in close proximity to the reaction tube 14, the sloped segment 33 has a capacitive coupling that is larger than those of the upper and lower windings 31, 32. Also, since the distance between the sloped segment 33 and the reaction tube 14 is substantially equal from the upper end to the lower end of the sloped segment 33, the capacitive coupling is substantially uniform over the entire length of the sloped segment 33.

In the following, the etching apparatus 10 will be described in terms of its functions.

A processing gas is introduced into the etching chamber 11 through the gas introducing passage 18. A desired etching atmosphere is formed in the etching chamber 11 by the processing gas, the conductance of the vacuum pump 19 and the exhaust passage 20. After the etching atmosphere has been stabilized, high frequency power is supplied from the coil power supply 25 to the coil antenna 23. The high frequency power causes the coil antenna 23 to oscillate and produce an electromagnetic wave. The electromagnetic wave is transmitted to the reaction tube 14 to ionize gas molecules and atoms and generates a plasma in the etching chamber 11. With the generation of the electromagnetic wave, the controller 29 starts the driver 28 to rotate the coil antenna 23 in the horizontal plane.

After the plasma has been stabilized to sufficiently generate etching ions, the biasing power supply 26 supplies biasing power to the sample carrier 21. This causes an ion assist reaction and ion bombardment, thereby initiating the etching of the wafer 22. Preferably, the driver 28 is started simultaneously with or prior to the supply of the biasing power.

Since low reactivity materials such as Pt, Ir, PZT and SBT have very low reactivities with most etchants, the wafer 22, which is made of a low reactivity material is subjected to sputter etching by ion bombardment. Products resulting from the sputter etching are not volatile molecules but are atoms of the low reactivity material scraped from the wafer 22. The atoms of the low reactivity material, i.e., the etching products, move toward the inner wall surface of the reaction tube 14.

The sloped segment 33 causes an ion sheath to form along the inner wall surface of the reaction tube 14 opposite to the sloped segment 33 of the coil antenna 23. A trace of ions within the plasma move toward the inner wall of the coil antenna 23, or toward the reaction tube 14, and collide with the inner wall surface of the reaction tube 14. The ion sheath is formed not only along the inner wall surface of the reaction tube 14 but also along the inner wall of a dielectric material, which transmits the electromagnetic wave oscillated from the coil antenna 23.

The etching products, which move toward the inner wall surface of the reaction tube 14, collide with etching ions accelerated by the ion sheath and diffuse. As a result, a relatively small amount of etching products attaches to the inner wall of the reaction tube 14 opposite to the coil antenna 23.

The sloped segment 33 has a substantially uniform coupling capacitance component. Therefore, the etching products substantially uniformly diffuse within the reaction tube 14 along the entire length of the coil antenna 23. For this reason, a uniform amount of etching products attaches to the inner wall of the reaction tube 14. As illustrated in FIG. 1, etching products 22a are attached uniformly on the inner wall of the reaction tube 14.

The large ion sheath increases the amount of etching ions that move toward the inner wall of the reaction tube 14. However, since the inductively coupled plasma generator generates highly dense etching ions, the large ion sheath will hardly affect the etching rate.

Figure 3A:
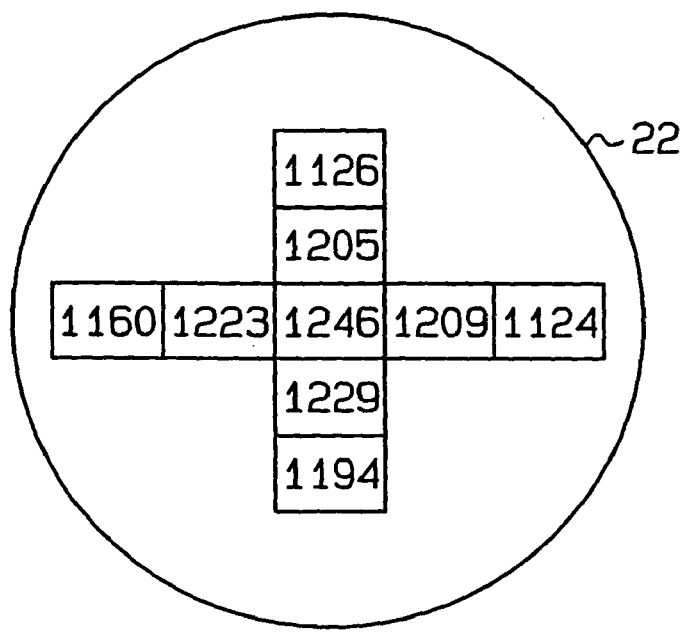
FIGS. 3a and 3b are schematic views each showing regions with different etching rates on a wafer.
Figure 3B:
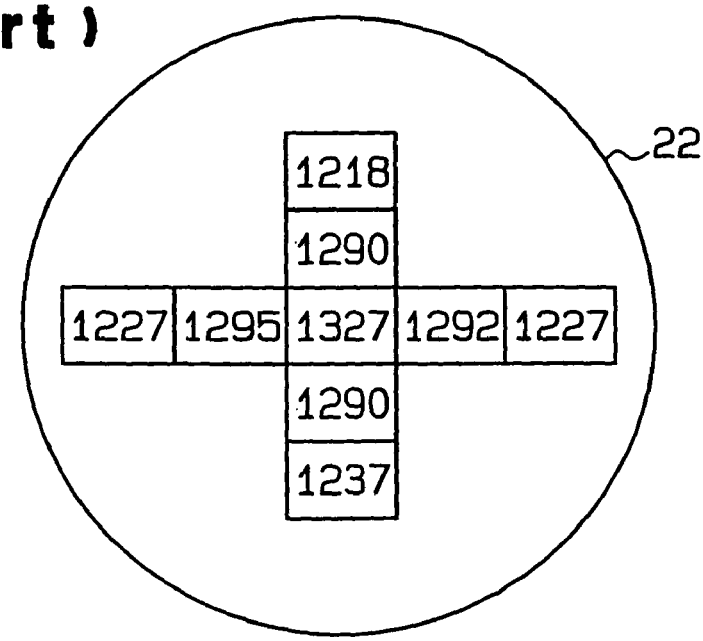

FIG. 3a shows the etching rate of a wafer 22 that was etched by the plasma etching apparatus 10 of the first embodiment. For comparison, FIG. 3b shows the etching rate of a wafer 22 that was etched by a conventional plasma etching apparatus. The etching rates slightly differ depending on the positions on the respective wafers 22.

The difference in the etching rate between FIGS. 3a and 3b falls within allowable variations in the etching step. Therefore, the etching rate was not adversely affected by the capacitive coupling that produced by the sloped segment 33. If the capacitive coupling significantly reduces the etching rate in FIG. 3a, the etching ion density may be increased by supplying additional power from the coil power supply 25. This cancels the influence of the capacitive coupling.

Figure 4:
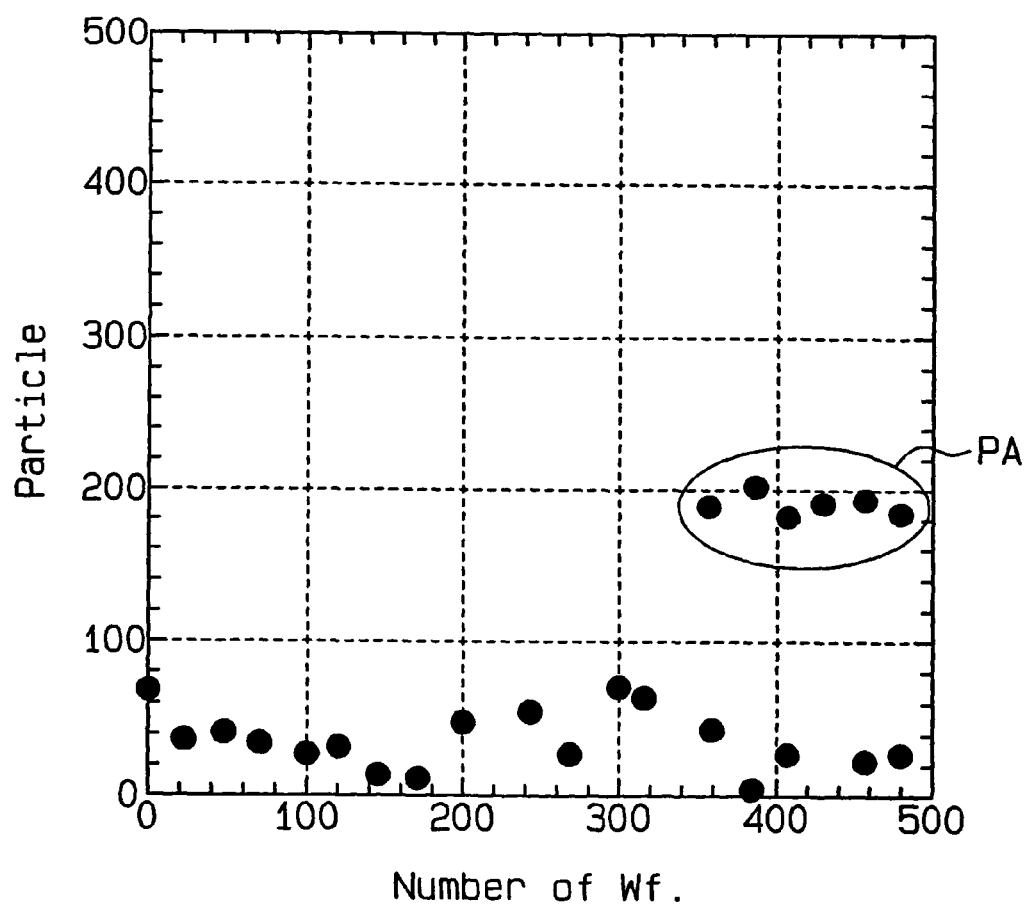
FIG. 4 is a graph illustrating a relationship between the number of processed wafers and the number of particles.

FIG. 4 is a graph showing the relationship between the number of processed wafers 22 and the amount of particles generated when FeRAM devices (made of ferroelectric material PZT and electrodes Pt) having a capacitor structure are formed on a wafer 22 in continuous etching. Points within an ellipse PA in FIG. 4 indicate data that resulted when a conventional etching apparatus was used. When 350 or more of wafers 22 were processed, the number of particles generated by the etching apparatus 10 of the first embodiment was less than the number of particles generated by the conventional etching apparatus. In other words, with the etching apparatus 10 of the first embodiment, even after approximately 500 wafers 22 were continuously etched, the number of particles was hardly increased, thereby eliminating the need for cleaning the processing chamber.

FIG. 5 shows the relationship between the rotational speed of the coil antenna 23 and the amount of generated particles. Particles having relatively large sizes (L size) were hardly generated. Therefore, the etching apparatus of the first embodiment prevents relatively large pieces from peeling off from the inner wall of the reaction tube 14 and dropping on the wafer 22.

The etching apparatus 10 of the first embodiment provides the following advantages:

(1) The sloped segment 33 of the coil antenna 23 is located in close proximity to the reaction tube 14. This causes a capacitive coupling produced between the sloped segment 33 and the reaction tube 14. Also, the coil antenna 23 is rotated around the reaction tube 14. As a result, the ion sheath, which accelerates ions within a plasma, is formed on the inner wall of the reaction tube 14. Most of the etching ions collide with the wafer 22 to produce etching products. A trace of the etching ions collides with the inner wall of the reaction tube 14. The etching products collide with the etching ions accelerated by the ion sheath and are diffused. The diffusion can prevent the etching products from attaching to the inner wall of the reaction tube 14, thereby extending the interval at which the reaction tube 14 should be cleaned.

(2) Since the sloped segment 33 is closer to the outer peripheral surface of the reaction tube 14 than the upper and lower windings 31, 32, a strong capacitive coupling is readily formed on at the corresponding part of the reaction tube 14. Since the coil antenna 23 rotates along the reaction tube 14, the attachment of the etching products on the inner wall of the reaction tube 14 is substantially uniformly reduced.

Figure 6:
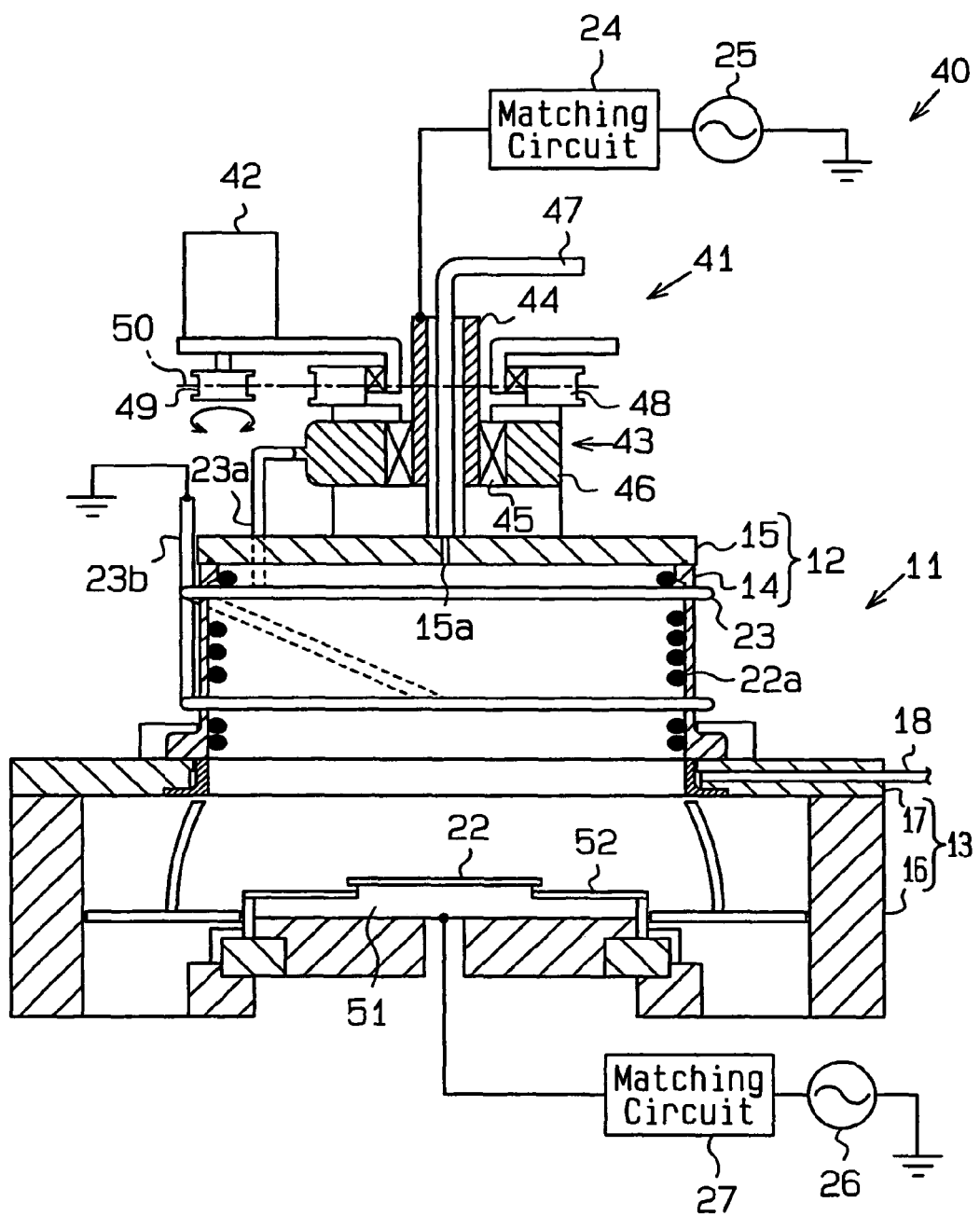
FIG. 6 is a schematic cross-sectional view illustrating a plasma etching apparatus according to a second embodiment of the present invention.

In the following, a plasma etching apparatus 40 according to a second embodiment of the present invention will be described with reference to FIG. 6, by mainly describing differences from the first embodiment.

The etching apparatus 40 has a driver 41 fixed on a lid 15 of an etching chamber 11. The driver 41 includes a motor 42, and a rotary connector 43 driven by the motor 42. The rotary connector 43 is formed of a hollow shaft 44, a bearing 45 mounted on the hollow shaft 44, and an annular output unit 46 rotatably supported by the bearing 45. The hollow shaft 44 is fixed to the lid 15.

The hollow shaft 44 is connected to a coil power supply 25 through a matching circuit 24. The output unit 46 is connected to a power supply terminal 23a of a coil antenna 23. High frequency power can be supplied to the output unit 46 from the hollow shaft 44. In this way, the power is supplied to the coil antenna 23 from the coil power supply 25 through the matching circuit 24 and the rotary connector 43. A pulley 48 is coaxially fixed to the output unit 46. A timing belt 50 is wound on the pulley 48 and a motor pulley 49 mounted to a driving shaft of the motor 42.

The lid 5 is formed with a communication hole 15a. A gas introducing pipe or gas introducing passage 47 is connected to the communication hole 15a through the hollow shaft 44. A processing gas is introduced into the etching chamber 11 through the gas introducing passage 47 and the communication hole 15a. A thermostat cable (not shown) for adjusting the temperature of the lid 15 is inserted through the gas introducing passage 47.

The lower processing chamber 13 is provided with a sample carrier, or an electrostatic chuck 51, for fixing a wafer 22. The electrostatic chuck 51 is connected to a biasing power supply 26 for supplying biasing power through the matching circuit 27. The electrostatic chuck 51 is formed at the center of the surface with a carrier which has an inner diameter smaller than the outer diameter of the wafer 22. A quartz plate 52, which is generally annular, is fixed on an annular surface of the electrostatic chuck 51.

Next, the etching apparatus 40 according to the second embodiment will be described in terms of its functions.

A processing gas introduced from the gas introducing passages 18, 47 is controlled at a desired pressure in the etching chamber 11. After a gas atmosphere has been stabilized in the etching chamber 11, high frequency power is supplied from the coil power supply 25 to the coil antenna 23. The coil antenna 23 oscillates and produces an electromagnetic wave. The electromagnetic wave is transmitted to the reaction tube 14 to ionize gas molecules and atoms and generate a plasma in the etching chamber 11.

A controller, not shown, starts the motor 42 at the time the coil power supply 25 generates the electromagnetic wave. This rotates the rotary connector 43 and the coil antenna 23, and forms an ion sheath near the coil antenna 23.

After the plasma has been stabilized to sufficiently generate etching ions, biasing power is supplied from the biasing power supply 26. This initiates the etching of a wafer 22. Etching products collide with ions accelerated by the ion sheath and are diffused. As a result, the etching products hardly attach to the inner wall of the reaction tube 14 near the coil antenna 23.

The etching apparatus 40 of the second embodiment provides the following advantage in addition to those of the first embodiment:

(1) The coil antenna 23 connected to the rotary connector 43 is rotated by the motor 42 around the reaction tube 14. Since the rotary connector 43 is fixed to the lid 15, the coil antenna 23 is accurately rotated along the peripheral wall of the reaction tube 14. This reduces variations in the depositing rate of the etching products.

(2) The hollow shaft 44 facilitates adjustments of the temperature of the lid 15 and the introduction of a gas into the etching chamber 11 from above.

Figure 7A:
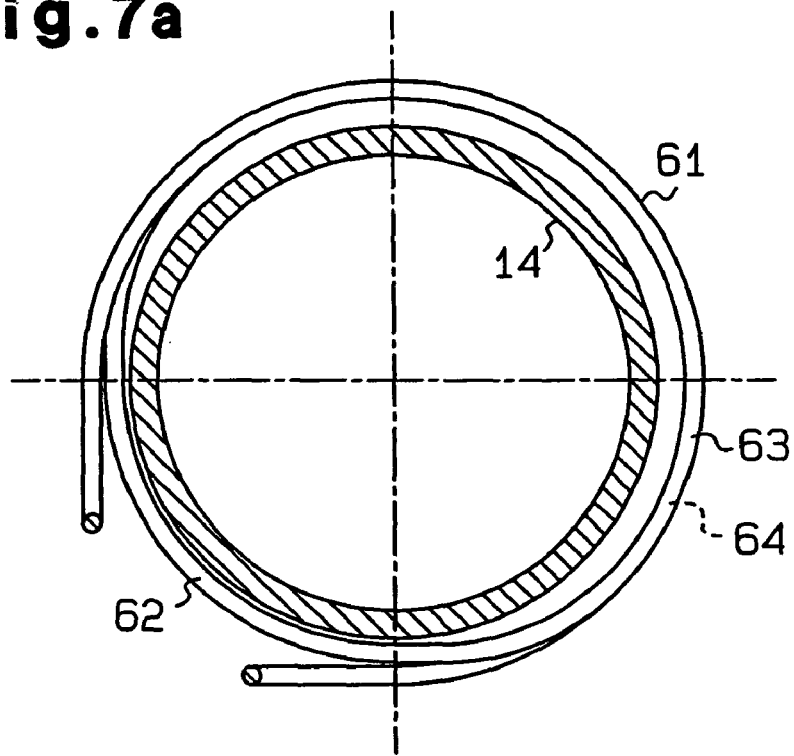
FIG. 7a is a plan view illustrating a high frequency antenna for use with an etching apparatus according to a third embodiment of the present invention.
Figure 7B:
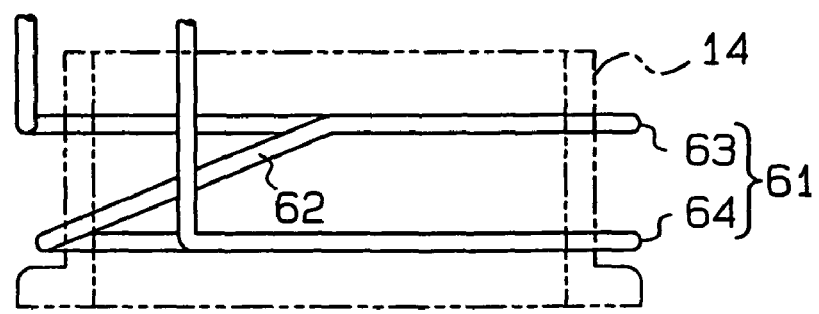

FIGS. 7a, 7b illustrate a coil antenna 61 according to a third embodiment.

The coil antenna 61 has a sloped segment 62 in close proximity to the outer peripheral surface of the reaction tube 14, and an upper and a lower winding 63, 64, which are continuous to the sloped segment 62. The upper and lower windings 63, 64 are spaced by a first distance from the outer peripheral surface of the reaction tube 14. The sloped segment 62 is located such that the distance between the sloped segment 62 and the outer peripheral surface of the reaction tube 14 slowly varies from the first distance to a second distance, at which the sloped segment 62 is closest to the outer peripheral surface of the reaction tube 14.

Figure 8A:
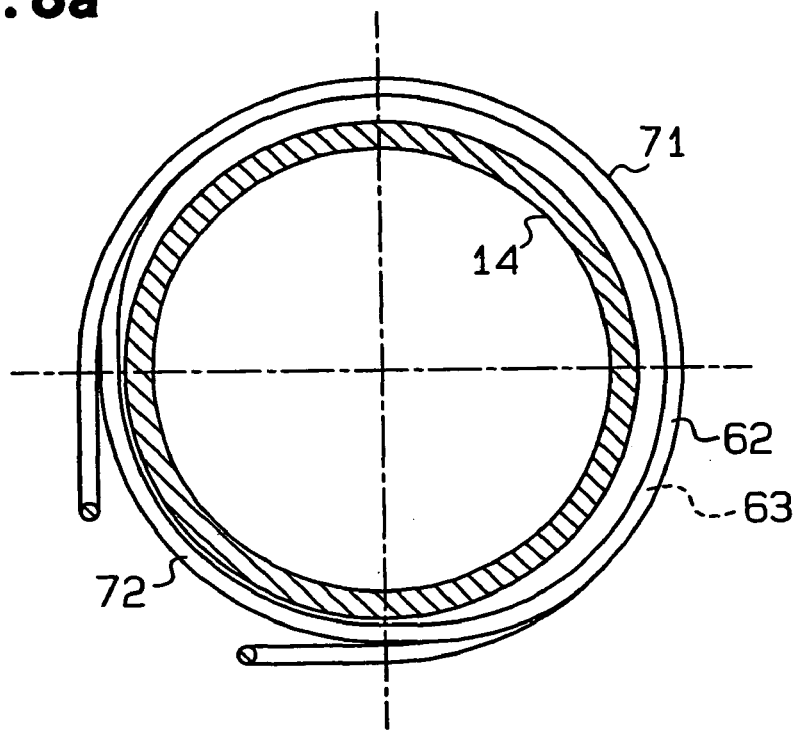
FIG. 8a is a cross-sectional view illustrating a high frequency antenna for use with an etching apparatus according to a fourth embodiment of the present invention.
Figure 8B:
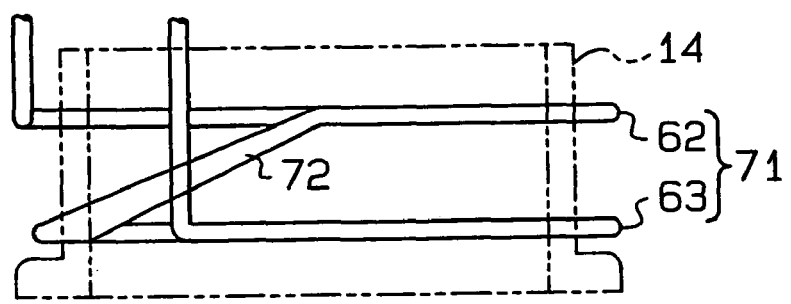

FIGS. 8a, 8b illustrate a coil antenna 71 according to a fourth embodiment.

The coil antenna 71 has a sloped segment 72, which gradually diverges from an upper winding 63 (on a power supply side) to a lower winding 64. This causes a uniformly distributed a capacitive coupling between the coil antenna 71 and the reaction tube 14. The uniformly distributed capacitive coupling reduces the rate of depositing of etching products and causes a uniform distribution of the deposits. Therefore, the problem of peeling of the etching products is reduced.

Figure 9A:
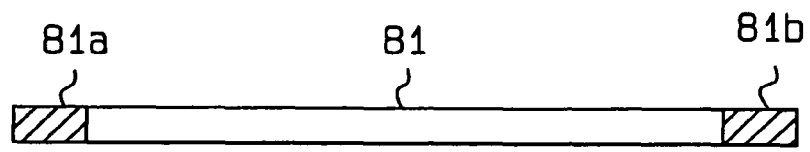
FIG. 9a is a cross-sectional view illustrating a plate material for a high frequency antenna for use with an etching apparatus according to a fifth embodiment of the present invention.
Figure 9B:
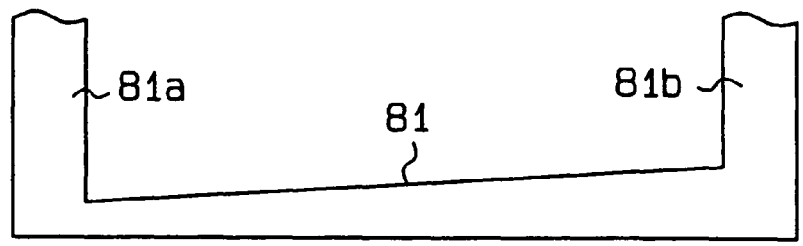

FIGS. 9a and 9b illustrate a plate material 81 that forms the coil antenna according to a fifth embodiment. The plate material 81 is wrapped around the outer peripheral surface of the reaction tube 14 approximately twice, and the distance between the plate material 81 and the reaction tube 14 is uniform. As illustrated in FIG. 9a, the plate material 81 has a uniform thickness. As illustrated in FIG. 9b, the plate material 81 is curved. The width of the plate material 81 gradually increases from a power supply terminal 81a to a ground terminal 81b.

The area of the surface of the coil antenna that faces the reaction tube 14 gradually increases from the power supply terminal 81a to the ground terminal 81b. With this shape, the capacitive coupling of the antenna is uniformly distributed. This reduces the depositing rate of etching products and causes uniform distribution of deposits over the inner wall surface of the reaction tube 14. Therefore, the problem of peeling of deposits is reduced.

Figure 10A:
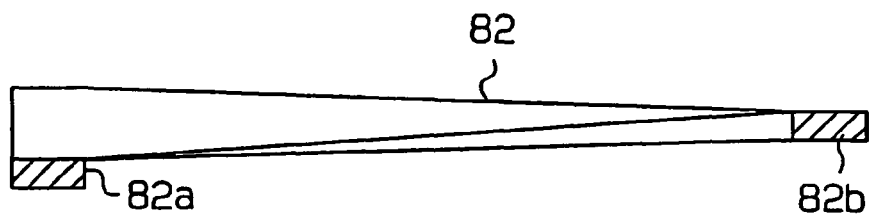
FIG. 10a is a cross-sectional view illustrating a plate material for a high frequency antenna according to a sixth embodiment of the present invention.
Figure 10B:
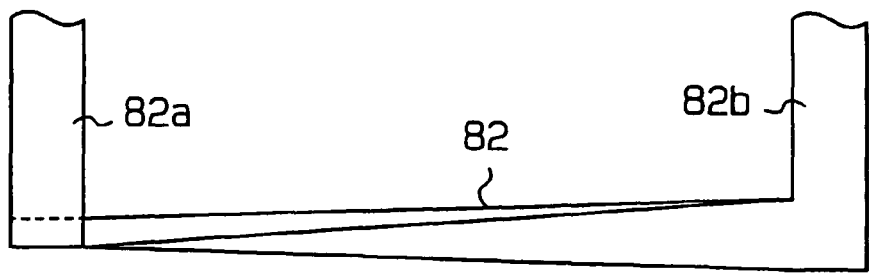

FIGS. 10a, 10b illustrate a plate material 82 for the coil antenna according to a sixth embodiment. The plate material 82 has a uniform plate thickness and width. The plate material 82 is twisted 90° between a power supply terminal 82a and a ground terminal 82b. The plate material 82 is wrapped around the outer peripheral surface of the reaction tube 14 approximately twice. The spacing between the plate material 82 and the outer peripheral surface of the reaction tube 14 is uniform. With this configuration, similar effects to those of the fifth embodiment are obtained.

The size of the ion sheath is changed by bringing the coil antenna 23 closer to the reaction tube 14 and by increasing the projected area of the antenna 23. It is therefore possible to compensate for differences in the amount of attaching products due to different etching materials and etchants and to reduce the attaching rate and extend the interval at which the reaction tube should be cleaned.

The respective embodiments described above may be modified as follows.

The present invention may be applied to apparatuses other than the plasma etching apparatuses 10 and 40. For example, the present invention may be applied to a plasma processing apparatus that uses a plasma generated by an inductively coupled plasma enhanced CVD system or the like to perform predetermined processing on a wafer 22. The present invention may also be applied to an etching apparatus and a chemical vapor deposition (CVD) system for use in manufacturing steps for manufacturing liquid crystal displays (LCD) or thin film magnetic heads (TFH).

The reaction tube 14, for example, may be rotated such that the reaction tube 14 moves relative to the coil antenna 23, instead of rotating the coil antenna 23. Alternatively, both the coil antenna 23 and the reaction tube 14 may be rotated in a horizontal plane. The relative movements of the coil antenna 23 to the reaction tube 14 may include vertical movements and a combination of rotation in a horizontal plane and vertical motion.

The controller 29 may variably adjust the moving speed of the coil antenna 23. This can reduce the depositing rates of etching products having different properties.

The number of times the coil antenna 23 is wrapped around the reaction tube 14 may be changed to approximately once or approximately three times or more.

The spacing between the upper winding 31 and the outer peripheral surface of the reaction tube 14 may be different from the spacing between the lower winding 32 and the outer peripheral surface of the reaction tube 14. For example, the spacing between the upper winding 31 and the outer peripheral surface of the reaction tube 14 may be larger than the spacing between the lower winding 32 and the outer peripheral surface of the reaction tube 14. In this way, the amount of capacitive coupling associated with the upper winding 31 can be made substantially identical to that associated with the lower winding 32.

The upper processing chamber 12 of the first embodiment may be defined using a quartz belljar in a temple bell shape.

Workpieces other than wafers 22 may be processed with this apparatus.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A plasma etching method for etching a workpiece, comprising:

providing a high frequency coil antenna comprising first and second winding segments, winding around and respectively facing toward a first height portion and a second height portion of an outer peripheral surface of a reaction tube and electrically connected to a power supply and a ground to generate a plasma inside the reaction tube, and a third inclined segment, successively extending between the first and the second winding segments in an inclined manner, winding around and facing toward a portion extending between the first and second height portions of the outer peripheral surface of the reaction tube to produce a relatively large uniformly distributed capacitive coupling with the reaction tube, said third segment being closer to the outer peripheral surface of the reaction tube than the first and second winding segments;

placing the workpiece in a processing chamber defined by the reaction tube made of a dielectric material;

introducing a processing gas into the processing chamber;

supplying high frequency power to the high frequency coil antenna winding around the outer peripheral surface of the reaction tube, the high frequency antenna having the third segment that faces the outer peripheral surface of the reaction tube and has a capacitive coupling with the outer peripheral surface of the reaction tube that has a greater magnitude relative to a magnitude of a capacitative coupling of the first and second winding segment of the high frequency antenna; and generating a plasma in the processing chamber to etch the workpiece by the supplied high frequency power while rotating the third segment of the high frequency antenna relative to the reaction tube along the outer peripheral surface of the reaction tube, and while maintaining a distance between the outer peripheral surface of the reaction tube and the third segment to be less than a distance between the outer peripheral surface of the reaction tube and the first and second winding segments.

2. A plasma etching method for etching a workpiece in an apparatus including a high frequency coil antenna comprising first and second winding segments, winding around and respectively facing toward a first height portion and a second height portion of an outer peripheral surface of a reaction tube made of dielectric, and electrically connected to a power supply, and a ground to generate a plasma inside the reaction tube, and a third segment, winding around and facing toward a portion extending between the first and second height portions of the outer peripheral surface of the reaction tube to produce a relatively large uniformly distributed capacitive coupling with the reaction tube, said third segment being closer to the outer peripheral surface of the reaction tube than the first and second winding segments, facing the outer peripheral surface of the reaction tube, and having a capacitive coupling with the outer peripheral surface of the reaction tube that has a greater magnitude relative to a magnitude of a capacitative coupling of the first and second winding segments of the high frequency antenna, comprising:

generating a plasma in the reaction tube to etch the workpiece while rotating the third segment of the high frequency antenna relative to the reaction tube along the outer peripheral surface of the reaction tube, wherein the third segment successively extends between the first and the second winding segments in an inclined manner, and maintaining a distance between the outer peripheral surface of the reaction tube and the third segment to be less than a distance between the outer peripheral surface of the reaction tube and the first and second winding segments.

* * * * *